(12) United States Patent
Senoo et al.

(10) Patent No.: US 9,666,579 B2
(45) Date of Patent: May 30, 2017

(54) SEMICONDUCTOR DEVICE

(71) Applicant: TOYOTA JIDOSHA KABUSHIKI KAISHA, Toyota-shi, Aichi-ken (JP)

(72) Inventors: Masaru Senoo, Okazaki (JP); Akitaka Soeno, Toyota (JP); Yasuhiro Hirabayashi, Nagoya (JP); Takashi Kuno, Kariya (JP); Yusuke Yamashita, Nagakute (JP); Satoru Machida, Nagakute (JP)

(73) Assignee: TOYOTA JIDOSHA KABUSHIKI KAISHA, Toyota-Shi (JP)

( * ) Notice: Subject to any disclaimer, the term of this patent is extended or adjusted under 35 U.S.C. 154(b) by 0 days.

(21) Appl. No.: 15/163,009

(22) Filed: May 24, 2016

(65) Prior Publication Data

US 2016/0351562 A1 Dec. 1, 2016

(30) Foreign Application Priority Data

May 26, 2015 (JP) ................. 2015-106860

(51) Int. Cl.
| | |
|---|---|
| *H01L 29/66* | (2006.01) |
| *H01L 27/06* | (2006.01) |
| *H01L 29/739* | (2006.01) |
| *H01L 29/10* | (2006.01) |
| *H01L 29/06* | (2006.01) |

(Continued)

(52) U.S. Cl.
CPC ........ *H01L 27/0664* (2013.01); *H01L 29/063* (2013.01); *H01L 29/0619* (2013.01); *H01L 29/0692* (2013.01); *H01L 29/1095* (2013.01); *H01L 29/36* (2013.01); *H01L 29/407* (2013.01); *H01L 29/66348* (2013.01); *H01L 29/7397* (2013.01); *H01L 29/872* (2013.01); *H01L 29/66143* (2013.01)

(58) Field of Classification Search
CPC ............ H01L 27/0664; H01L 29/0692; H01L 29/0619; H01L 29/407; H01L 29/36; H01L 29/7397; H01L 29/872; H01L 29/063; H01L 29/1095; H01L 29/66348; H01L 29/66143
See application file for complete search history.

(56) References Cited

U.S. PATENT DOCUMENTS

| | | | | |
|---|---|---|---|---|
| 2009/0278166 | A1* | 11/2009 | Soeno | H01L 27/0664 257/133 |
| 2013/0009206 | A1* | 1/2013 | Soeno | H01L 29/7397 257/140 |

(Continued)

FOREIGN PATENT DOCUMENTS

JP 2013-048230 A 3/2013

*Primary Examiner* — Victor A Mandala
(74) *Attorney, Agent, or Firm* — Andrews Kurth Kenyon LLP

(57) ABSTRACT

In a plan view of a semiconductor substrate, the semiconductor substrate includes a pillar exposing area in which the pillar region is exposed on the front surface of the semiconductor substrate, a pillar contacting area in which the pillar region is in contact with a deeper side of the anode contact region, and an anode contacting area in which the anode region is in contact with the deeper side of the anode contact region. In a direction along which the pillar contacting area and the anode contacting area are aligned, a width of the pillar contacting area is smaller than a width of the anode contacting area.

5 Claims, 11 Drawing Sheets

(51) Int. Cl.
    *H01L 29/872*     (2006.01)
    *H01L 29/36*     (2006.01)
    *H01L 29/40*     (2006.01)

(56) References Cited

U.S. PATENT DOCUMENTS

| | | | |
|---|---|---|---|
| 2014/0048847 A1* | 2/2014 | Yamashita | H01L 29/407 257/140 |
| 2014/0077253 A1* | 3/2014 | Soeno | H01L 29/32 257/139 |
| 2015/0249083 A1* | 9/2015 | Okawara | H01L 27/0635 257/140 |
| 2016/0240641 A1* | 8/2016 | Okawara | H01L 29/7397 |
| 2016/0276469 A1* | 9/2016 | Machida | H01L 29/0834 |
| 2016/0315140 A1* | 10/2016 | Iwasaki | H01L 29/32 |
| 2017/0025410 A1* | 1/2017 | Cheng | H01L 27/0716 |

* cited by examiner

FIG. 2
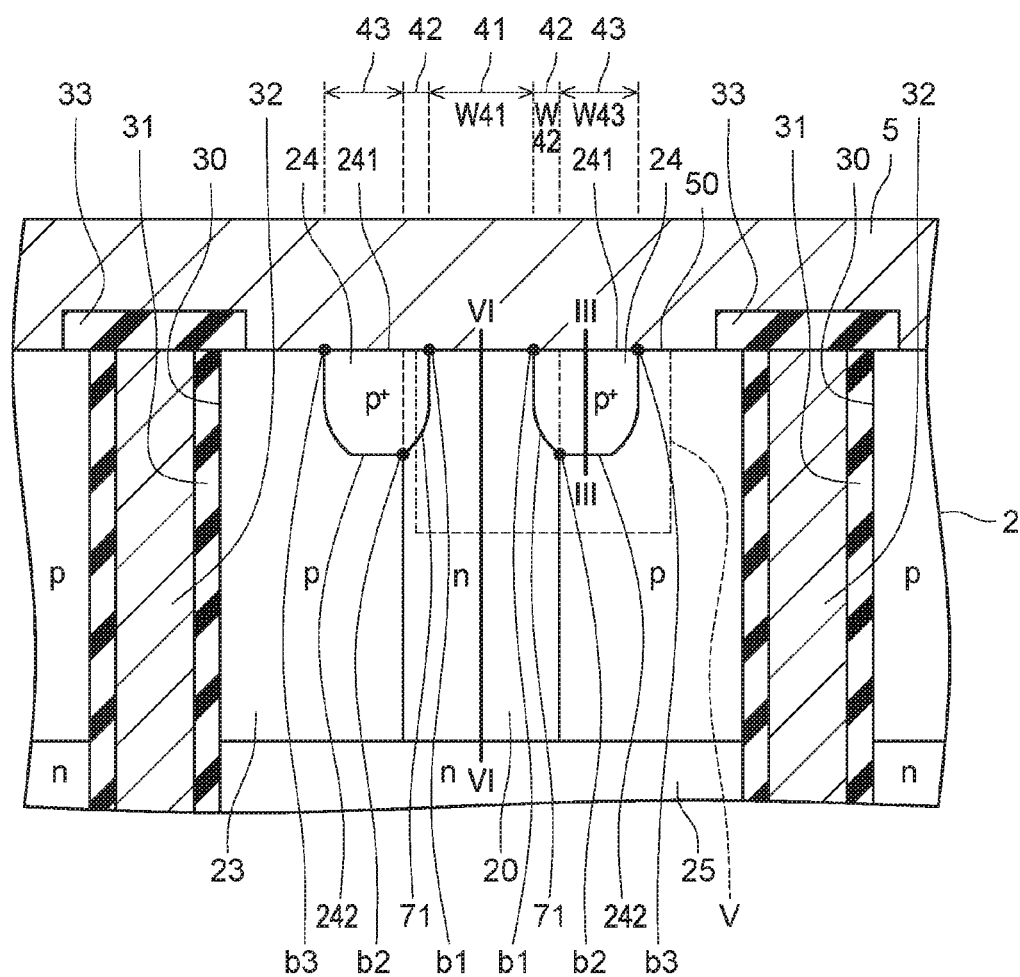
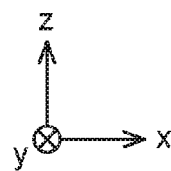

FIG. 4
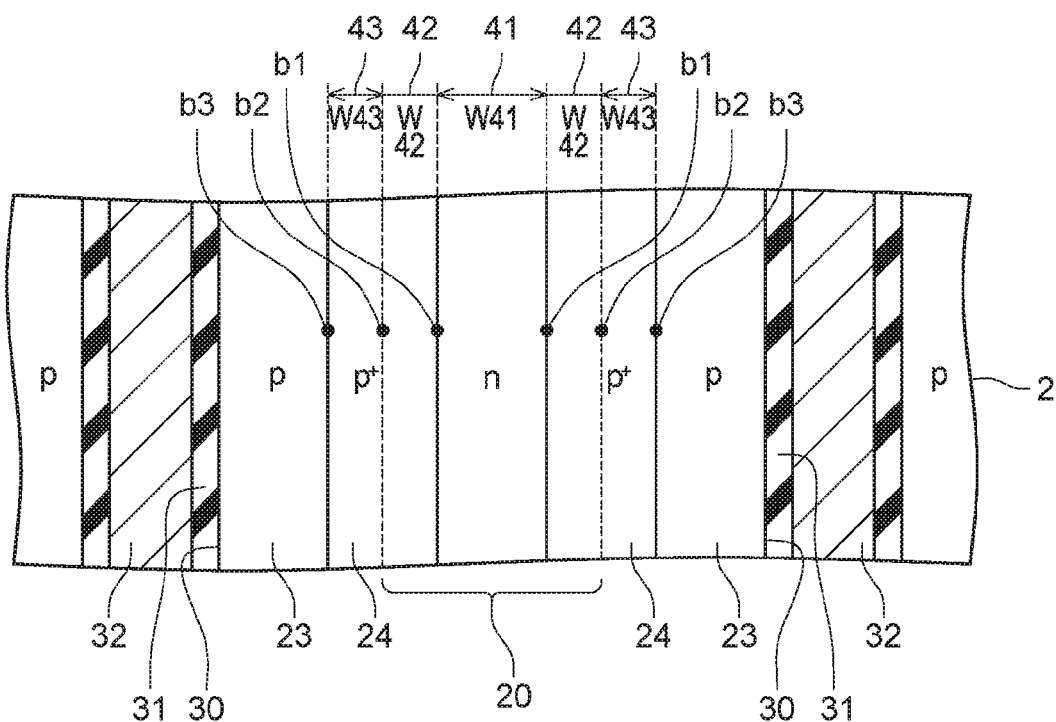
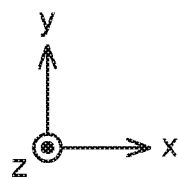

SEMICONDUCTOR DEVICE

CROSS-REFERENCE TO RELATED APPLICATION(S)

This application claims priority to Japanese Patent Application No. 2015-106860 filed on May 26, 2015, the entire contents of which are hereby incorporated by reference into the present application.

TECHNICAL FIELD

The present application relates to a semiconductor device.

DESCRIPTION OF RELATED ART

As shown in FIG. 11, a semiconductor device 101 disclosed in Japanese Patent Application Publication No. 2013-048230 is provided with a semiconductor substrate 102, a front surface electrode 105 provided on a front surface 150 of the semiconductor substrate 102, and a back surface electrode 106 provided on a back surface 160 of the semiconductor substrate 102. An IGBT region 103 and a diode region 104 are provided on one single semiconductor substrate 102.

The IGBT region 103 includes an n-type drift region 113, an n-type barrier region 115 provided on a front surface side of the drift region 113, a p-type body region 116 provided on a front surface side of the barrier region 115, n-type emitter regions 117 provided on a front surface side of the p-type body region 116 and configured to electrically connect to the front surface electrode 105, and p-type body contact regions 118 provided on the front surface side of the body regions 116 at positions different from those of the emitter regions 117, having a higher impurity concentration than the body region 116, and configured to electrically connect to the front surface electrode 105. Further, the IGBT region 103 includes a plurality of gate trenches 130 extending from the front surface 150 of the semiconductor substrate 102 and piercing the emitter regions 117, the body region 116, and the bather region 115, to a depth reaching the drift region 113. Further, the IGBT region 103 includes n-type pillar regions 120 between adjacent gate trenches 130, extending from the front surface 150 of the semiconductor substrate 102 and piercing the body region 116, to a depth reaching the bather region 115, and configured to electrically connect to the front surface electrode 105 and the barrier region 115.

The diode region 104 includes the n-type drift region 113, an n-type barrier region 125 provided on the front surface side of the drift region 113, a p-type anode region 123 provided on a front surface side of the barrier region 125, p-type anode contact regions 124 provided on a front surface side of the anode region 123, having a higher impurity concentration than the anode region 123, and configured to electrically connect to the front surface electrode 105. Further, the diode region 104 includes a plurality of gate trenches 130 extending from the front surface 150 of the semiconductor substrate 102 and piercing the anode contact regions 124, the anode region 123, and the barrier region 125, to a depth reaching the drill region 113. Further, the diode region 104 includes n-type pillar regions 120 between adjacent gate trenches 130, extending from the front surface 150 of the semiconductor substrate 102 and piercing the anode region 123, to a depth reaching the barrier region 125, and configured to electrically connect to the front surface electrode 105 and the barrier region 125. In this semiconductor device 101, the anode contact regions 124 and the pillar regions 120 are separated from each other.

Notably, an n-type buffer region 112 is provided on a back surface side of the drift region 113. The IGBT region 103 includes a p-type collector region 111 provided on a back surface side of the buffer region 112. The diode region 104 includes an n-type cathode region 121 provided on the back surface side of the buffer region 112. A gate electrode 132 and a gate insulating film 131 arc provided in each of the gate trenches 130. An interlayer insulating film 133 is provided on each of the gate electrodes 132.

In the above semiconductor device 101, a density of channels provided along the gale trenches 130 in the IGBT region 103 (number of channels per unit area of the IGBT region 103) may be considered to be increased for easier current flow in the IGBT region 103. On that account, a configuration may be considered in which intervals between adjacent gate trenches 130 in the IGBT region 103 are made smaller to increase a number of the gate trenches 130 per unit area of the semiconductor substrate 102, so that a density of the gate trenches 130 is increased.

Upon forming the plurality of gate trenches 130, since the gate trenches 130 in the IGBT region 103 and the gate trenches 130 in the diode region 104 are formed in the same step, so an increase in the density of the gate trenches 130 in the IGBT region 103 would require a density of the gate trenches 130 in the diode region 104 to be increased as well, otherwise a voltage resistance performance of the diode region 104 would be decreased. With the increased density of the gate trenches 130 in the diode region 104, intervals between the adjacent gate trenches 130 in the diode region 104 would become smaller.

When the intervals between the adjacent gate trenches 130 in the diode region 104 become smaller, regions between those gate trenches 130 for providing the pillar regions 120 are made smaller. Further, regions for providing the anode contact regions 124 also become smaller. As a result of this, intervals between the anode contact regions 124 and the pillar regions 120 become tight upon forming the anode contact regions 124 and the pillar regions 120 in the diode region 104, and there is a risk that the anode contact regions 124 and the pillar regions 120 are overlapped and make contact. When the p-type anode contact regions 124 and the n-type pillar regions 120 make contact, pn-junction diodes are undesirably formed by the anode contact regions 124 and the pillar regions 120.

When the diode is turned on in such a semiconductor device (when a voltage that acts as a forward voltage for the diode region 104 is applied), holes flow into the pillar regions 120 from the anode contact regions 124 forming the pn-junction diodes by the contact therewith, and excessive holes are accumulated in the semiconductor substrate 102. When such a circumstance occurs, further time is required for the holes accumulated in the semiconductor substrate 102 to be discharged upon when the diode is recovered (when a voltage that acts as a reverse voltage for the diode region 104 is applied), as a result of which a switching speed may be slowed down.

Disclosed herein is a technique that can suppress an amount of holes flowing into a pillar region from an anode contact region even when a gate trench density is increased.

BRIEF SUMMARY OF INVENTION

A semiconductor device disclosed herein comprises a semiconductor substrate including an IGBT region and a diode region, and a front surface electrode provided on a front surface of the semiconductor substrate. The IGBT region comprises, an n-type drift region, an n-type barrier region provided on a front surface side of the drift region, a p-type body region provided on a front surface side of the barrier region, an n-type emitter region provided on a front surface side of the body region and configured to electrically connect to the front surface electrode, a p-type body contact region provided on the front surface side of the body region at a position different from a position of the emitter region, the p-type body contact region having an impurity concentration higher than an impurity concentration of the body region, and configured to electrically connect to the front surface electrode, a plurality of gate trenches extending from the front surface of the semiconductor substrate, piercing the emitter region, the body region and the barrier region and reaching the drift region; and an n-type pillar region extending from the front surface of the semiconductor substrate between adjacent gate trenches, piercing the body region and reaching the bather region, and configured to electrically connect to the front surface electrode and the barrier region. The diode region comprises an n-type drill region, an n-type bather region provided on a front surface side of the drift region, a p-type anode region provided on a front surface side of the barrier region, a p-type anode contact region provided on at least a part of a front surface side of the anode region, the p-type anode contact region having the impurity concentration higher than an impurity concentration of the anode region, and configured to electrically connect to the front surface electrode, a plurality of gate trenches extending from the front surface of the semiconductor substrate, piercing at least the anode region and the banger region and reaching the drift region, and an n-type pillar region extending from the front surface of the semiconductor substrate between adjacent gate trenches, piercing the anode contact region and the anode region and reaching the harrier region, and configured to electrically connect to the front surface electrode and the barrier region. In a plan view of the semiconductor substrate, the semiconductor substrate includes a pillar exposing area in which the pillar region is exposed on the front surface of the semiconductor substrate, a pillar contacting area in which the pillar region is in contact with a deeper side of the anode contact region, and an anode contacting area in which the anode region is in contact with the deeper side of the anode contact region. In a direction along which the pillar contacting area and the anode contacting area are aligned, a width of the pillar contacting area is smaller than a width of the anode contacting area.

In this semiconductor device, in the diode region, one end of the anode contact region in a width direction may make contact with the pillar region, and the other end may extend to the gate trenches. That is, the anode contact region may be provided over an entire width of the anode region on the front surface side.

In this semiconductor device, since the anode contact region and the pillar region are allowed to make contact, a region for providing the anode contact region and the pillar region between adjacent gate trenches can be made small. Due to this, a density of the gate trenches can be increased by increasing a number of the gate trenches.

Further, in this semiconductor device, a pn-junction diode is formed by the p-type anode contact region and the n-type pillar region making contact. In this semiconductor device, when the diode is turned on (when a voltage that acts as a forward voltage for the diode region is applied), holes flow into the pillar region from the anode contact region forming the pn-junction diode by the contact therewith. At this occasion, according to the above configuration, since the width of the pillar contacting area where the pillar region makes contact on the deeper side of the anode contact region is smaller than the width of the anode contacting area where the anode region makes contact on the deeper side of the anode contact region, a contact area of the anode contact region and the pillar region can be made small. Due to this, an amount of the holes flowing into the pillar region from the anode contact region can be suppressed. According to the above semiconductor device, the amount of the holes flowing into the pillar region from the anode contact region can be suppressed even when the density of the gate trenches is increased.

As a result of the above, no excessive holes are accumulated in the semiconductor substrate, so time is required for the holes accumulated in the semiconductor substrate to be discharged upon when the diode is recovered (when a voltage that acts as a reverse voltage for the diode region is applied) becomes short, as a result of which a switching speed can be made fast.

BRIEF DESCRIPTION OF DRAWINGS

FIG. 2 is a cross sectional diagram of a primary part II of FIG. 1;

FIG. 4 is a diagram seeing the semiconductor substrate of FIG. 2 in a plan view;

DETAILED DESCRIPTION OF INVENTION

Figure 1:
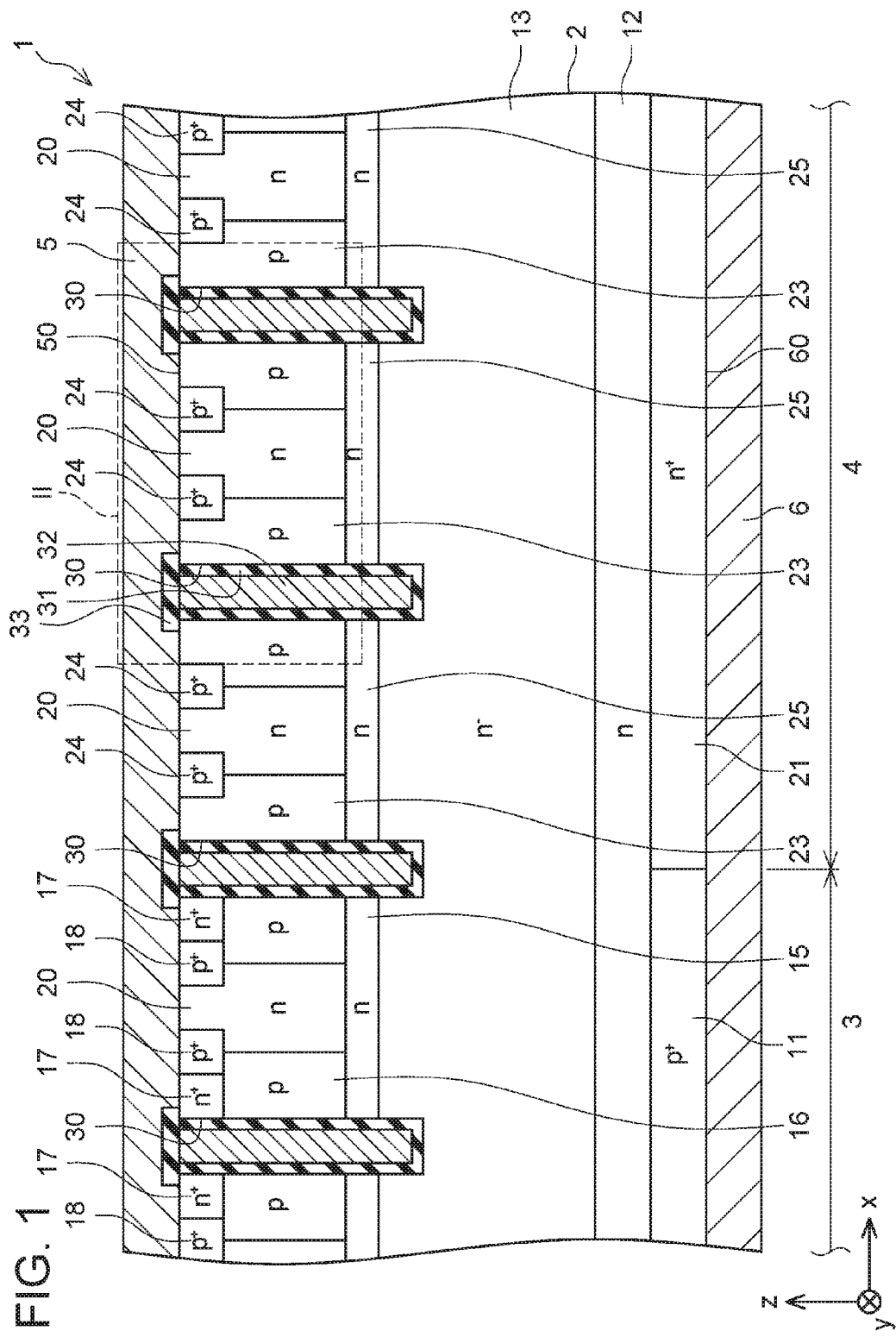
FIG. 1 is a cross sectional diagram of a semiconductor device of a first embodiment.

As shown in FIG. 1, a semiconductor device 1 of a first embodiment comprises a semiconductor substrate 2, a front surface electrode 5 provided on a front surface 50 of the semiconductor substrate 2, and a back surface electrode 6 provided on a back surface 60 of the semiconductor substrate 2.

The semiconductor substrate 2 comprises an IGBT region 3 and a diode region 4. The IGBT region 3 and the diode region 4 are provided adjacent to each other. The IGBT region 3 and the diode region 4 are provided on the same single semiconductor substrate 2. The IGBT region 3 and the diode region 4 are provided so as to align in a lateral direction (x direction). Semiconductor elements are provided in the semiconductor substrate 2. An IGBT (Insulated Gate Bipolar Transistor) is provided in the IGBT region 3 of the semiconductor substrate 2. A FWD (Free Wheeling Diode) is provided in the diode region 4 of the semiconductor substrate 2. The IGBT and the FWD are provided in a reverse-parallel state. Due to this, an RC-ICBT (Reverse Conducting Insulated Gate Bipolar Transistor) is provided.

The front surface electrode 5 and the back surface electrode 6 are configured for example of one or more of metal such as aluminum (Al), aluminum silicon (AlSi), titanium (Ti), nickel (Ni), gold (Au) and the like. The front surface electrode 5 covers the front surface 50 of the semiconductor substrate 2. The back surface electrode 6 covers the back surface 60 of the semiconductor substrate 2. The front surface electrode 5 and the back surface electrode 6 are both provided over both of the IGBT region 3 and the diode region 4 of the semiconductor substrate 2.

The IGBT region 3 of the semiconductor substrate 2 comprises a collector region 11, a buffer region 12, a drift region 13, a barrier region 15, a body region 16, emitter regions 17, and body contact regions 18 in this order from a back surface 60 side to a front surface 50 side. Further, the diode region 4 of the semiconductor substrate 2 comprises a cathode region 21, a buffer region 12, a drift region 13, a barrier region 25, an anode region 23, and anode contact regions 24 in this order from the back surface 60 side to the front surface 50 side. The buffer region 12 and the drift region 13 are provided in common to both the IGBT region 3 and the diode region 4. Further, the semiconductor substrate 2 comprises a plurality of pillar regions 20. Further, the semiconductor substrate 2 comprises a plurality of gate trenches 30.

(IGBT Region 3)

The collector region 11 is a p-type region. The collector region 11 has a high impurity concentration. The collector region 11 is provided on a back surface side of the buffer region 12. The collector region 11 is provided in an area that is exposed on the back surface 60 of the semiconductor substrate 2. The collector region 11 makes an ohmic contact with the back surface electrode 6. The collector region 11 is configured to electrically connect to the back surface electrode 6.

The buffer region 12 is an n-type region. The buffer region 12 is provided on a front surface side of the collector region 11. The buffer region 12 is provided between the collector region 11 and the drift region 13.

The drift region 13 is an n-type region. An impurity concentration of the drift region 13 is lower than an impurity concentration of the buffer region 12. The drift region 13 is provided on a front surface side of the buffer region 12. The drift region 13 is provided between the buffer region 12 and the barrier region 15.

The barrier region 15 is an n-type region. An impurity concentration of the bather region 15 is higher than the impurity concentration of the drift region 13. The bather region 15 is provided on a front surface side of the drift region 13. The barrier region 15 is provided between the drift region 13 and the body region 16. Ends of the barrier region 15 in a lateral direction (x direction) make contact with corresponding gate trenches 30.

The body region 16 is a p-type region. An impurity concentration of the body region 16 is lower than the impurity concentration of the collector region 11. The body region 16 is provided on a front surface side of the bather region 15. The body region 16 is provided between the barrier region 15 and the emitter regions 17 as well as the body contact regions 18. The body region 16 is provided in an area making contact with the gate trenches 30. When gate electrodes 32 within the gate trenches 30 are brought to an ON potential, a channel is formed in the body region 16 adjacent to each of the gate trenches 30.

The emitter regions 17 are n-type regions. An impurity concentration of the emitter regions 17 is higher than the impurity concentration of the barrier region 15. The emitter regions 17 are provided on a front surface side of the body region 16. The emitter regions 17 are provided in areas making contact with the gate trenches 30. The emitter regions 17 are each termed in an island shape in an area that is exposed on the front surface 50 of the semiconductor substrate 2. The emitter regions 17 make ohmic contact with the front surface electrode 5. The emitter regions 17 are configured to electrically connect to the front surface electrode 5.

The body contact regions 18 are p-type regions. An impurity concentration of the body contact regions 18 is higher than the impurity concentration of the body region 16. The body contact regions 18 are provided on the front surface side of the body region 16. The body contact regions 18 are provided at positions different from those of the emitter regions 17. The body contact regions 18 are each formed in an island shape in the area that is exposed on the front surface 50 of the semiconductor substrate 2. The body contact regions 18 make ohmic contact with the front surface electrode 5. The body contact regions 18 are configured to electrically connect to the front surface electrode 5.

(Diode Region 4)

The cathode region 21 is an n-type region. An impurity concentration of the cathode region 21 is higher than an impurity concentration of the buffer region 12. The cathode region 21 is provided on a back surface side of the buffer region 12. The cathode region 21 is provided in an area that is exposed on the back surface 60 of the semiconductor substrate 2. The cathode region 21 makes ohmic contact with the back surface electrode 6. The cathode region 21 is configured to electrically connect to the back surface electrode 6.

The buffer region 12 is an n-type region. The buffer region 12 is provided on a front surface side of the cathode region 21. The buffer region 12 is provided between the cathode region 21 and the drift region 13. The drift region 13 is provided between the buffer region 12 and the barrier region 25. The buffer region 12 and the drift region 13 are both provided over both of the IGBT region 3 and the diode region 4.

The bather region 25 is an n-type region. An impurity concentration of the barrier region 25 is higher than the impurity concentration of the drift region 13. The bather region 25 is provided on a front surface side of the drift region 13. The drift region 13 is provided between the buffer region 12 and the barrier region 25. The barrier region 25 is provided between the drift region 13 and the anode region 23. Ends of the bather region 25 in the lateral direction (x direction) make contact with corresponding gate trenches 30.

The anode region 23 is a p-type region. An impurity concentration of the anode region 23 is equal to the impurity concentration of the body region 16. The anode region 23 is provided on a front surface side of the bather region 25. The anode region 23 is provided between the barrier region 25 and the anode contact regions 24. The anode region 23 is provided in an area making contact with the gate trenches 30.

The anode contact regions 24 are p-type regions. An impurity concentration of the anode contact regions 24 is higher than the impurity concentration of the anode region 23. The anode contact regions 24 are provided on a front surface side of the anode region 23. The anode contact regions 24 are each formed in an island shape in an area that is exposed on the front surface 50 of the semiconductor substrate 2. The anode contact regions 24 make ohmic contact with the front surface electrode 5. The anode contact regions 24 are configured to electrically connect to the front surface electrode 5.

As shown in FIG. 2, each anode contact region 24 is shaped so that its width in a direction along which the IGBT region 3 and the diode region 4 are aligned (x direction) becomes smaller at positions farther away from the front surface 50 of the semiconductor substrate 2, toward a deeper side along a depth direction (z direction) of the semiconductor substrate 2. In each anode contact region 24, the width of a lower end 242 in the x direction is smaller than the width of an upper end 241 in the x direction.

Figure 3:
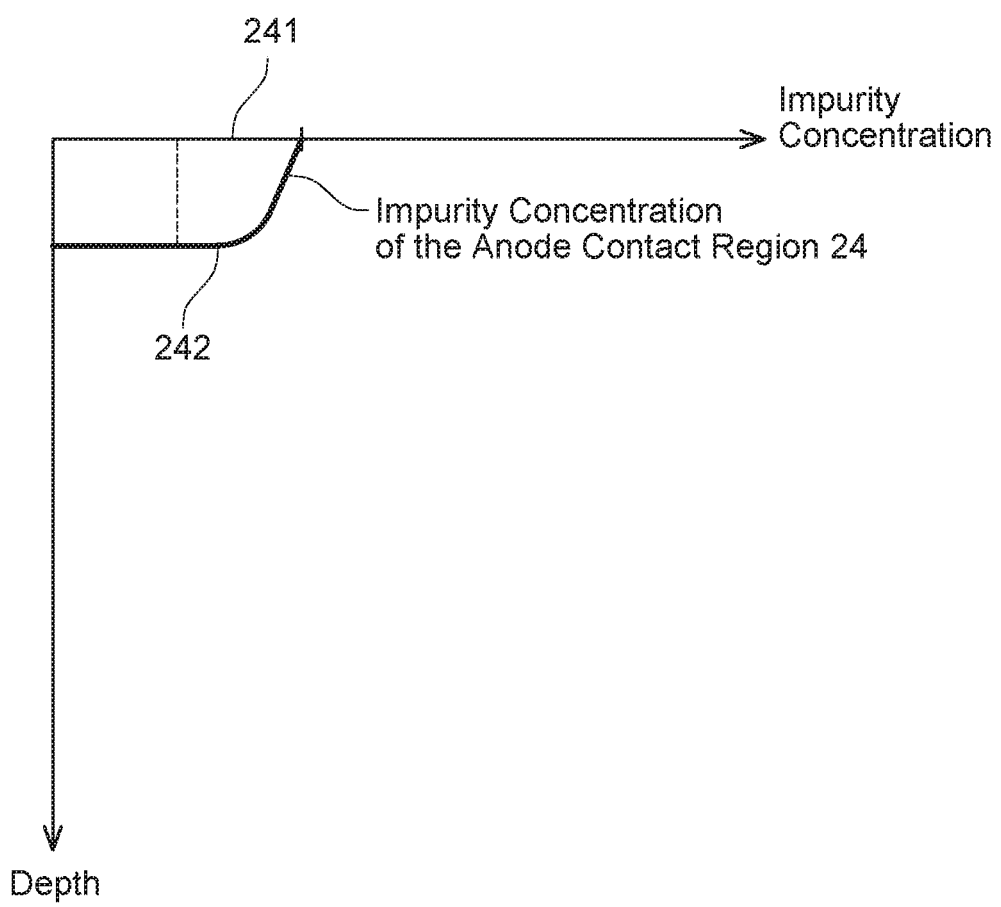
FIG. 3 is a diagram indicating an impurity concentration profile at a III-III cross section in FIG. 2.

As shown in FIG. 3, the impurity concentration of each anode contact region 24 gradually changes along the depth direction (z direction) of the semiconductor substrate 2. The impurity concentration of each anode contact region 24 gradually drops on the deeper side along the depth direction (z direction) of the semiconductor substrate 2, being lower at positions farther away from the front surface 50 of the semiconductor substrate 2. The impurity concentration of the lower ends 242 of the anode contact regions 24 is lower than the impurity concentration of the upper ends 241 of the anode contact regions 24. However, the impurity concentration of the lower ends 242 of the anode contact regions 24 is higher than half the impurity concentration of the upper ends 241 of the anode contact regions 24.

As shown in FIG. 1, the plurality of gate trenches 30 is provided at regular intervals along the x direction. The gate trenches 30 extend from the front surface 50 of the semiconductor substrate 2 toward a back surface 60 side (in the z direction). In the IGBT region 3, the gate trenches 30 extend from the front surface 50 of the semiconductor substrate 2 to a depth piercing the emitter regions 17, the body region 16, and the barrier region 15 and reaching the drift region 13. In the diode region 4, the gate trenches 30 extend from the front surface 50 of the semiconductor substrate 2 to a depth piercing the anode region 23 and the barrier region 25 and reaching the drift region 13. The gate electrode 32 and a gate insulating film 31 are provided inside each gate trench 30.

The gate electrodes 32 are housed inside the gate trenches 30. The gate electrodes 32 are housed on inner sides than the gate insulating films 31. The gate electrodes 32 are configured for example of aluminum (Al) or polysilicon (Poly-Si). An interlayer insulating film 33 is disposed on each gate electrode 32. The interlayer insulating films 33 insulate the gate electrodes 32 from the front surface electrode 5.

The gate insulating films 31 are configured for example of silicon oxide ($SiO_2$). The gate insulating films 31 cover inner surfaces of the gate trenches 30. Each gate insulating film 31 is arranged between the corresponding gate electrode 32 and the semiconductor substrate 2. The gate insulating films 31 insulate the gate electrodes 32 from the semiconductor substrate 2.

The pillar regions 20 are provided between adjacent gate trenches 30. The pillar regions 20 are n-type regions. An impurity concentration of the pillar regions 20 is equal to the impurity concentrations of the barrier regions 15, 25. The impurity concentration of the pillar regions 20 is higher than the impurity concentration of the drift region 13. In the IGBT region 3, the pillar regions 20 extend from the front surface 50 of the semiconductor substrate 2 to a position piercing the body contact regions 18 and the body region 16, and reaching the barrier region 15. In the diode region 4, the pillar regions 20 extend from the front surface 50 of the semiconductor substrate 2 to a position piercing the anode contact regions 24 and the anode region 23, and reaching the barrier region 25. Each of the pillar regions 20 is connected to the front surface electrode 5 and its corresponding barrier region 15 or 25. The pillar regions 20 make Schottky contact with the front surface electrode 5. Each of the pillar regions 20 is configured to electrically connect to the front surface electrode 5 and its corresponding barrier region 15 or 25.

As shown in FIG. 2, one part of each pillar region 20 makes contact with its corresponding anode contact regions 24, and another part of each pillar region 20 makes contact with the anode region 23. Further, one part of each anode contact region 24 makes contact with the corresponding pillar region 20, and another part of each anode contact region 24 makes contact with the anode region 23. The one part of each anode contact region 24 projects out toward its corresponding pillar region 20 side, and the other part of the anode contact region 24 projects out toward the anode region 23. Interfaces 71 between the anode contact regions 24 and the pillar regions 20 are curved. The interfaces 71 primarily extend in the depth direction (vertical direction) of the semiconductor substrate 2.

As shown in FIG. 4, when the semiconductor substrate 2 is seen its plan view, the semiconductor substrate 2 includes pillar exposing areas 41 in each of which the pillar region 20 has reached the front surface 50 of the semiconductor substrate 2, pillar contacting areas 42 in each of which the pillar region 20 is in contact with a deeper side of the corresponding anode contact region 24, and anode contacting areas 43 in each of which the anode region 23 is in contact with the deeper side of the corresponding anode contact region 24. Between the adjacent gate trenches 30, a pillar exposing area 41 and two pillar contacting areas 42 and two anode contacting areas 43 are aligned in the direction along Which the plurality of gate trenches 30 is aligned (x direction). In the x direction, the pillar exposing area 41 and the pillar contacting areas 42 are adjacent, and the pillar contacting areas 42 and the anode contacting areas 43 are respectively adjacent.

When the portion between the adjacent gate trenches 30 on the front surface 50 of the semiconductor substrate 2 is observed, the pillar exposing area 41 is positioned on a pillar region 20 side than boundaries b1 between the pillar region 20 and the anode contact region 24. The pillar contacting areas 42 are positioned on an anode contact region 24 side than the boundaries b1 between the pillar region 20 and the anode contact region 24. Further, when a position deeper than the front surface 50 of the semiconductor substrate 2 is observed, the pillar contacting areas 42 are positioned on the pillar region 20 side than boundaries b2 between the pillar region 20 and the anode region 23. The anode contacting areas 43 are positioned on the anode region 23 side than the boundaries b2 between the pillar region 20 and the anode region 23. Further, when the front surface 50 of the semiconductor substrate 2 is observed, the anode contacting areas 43 are positioned on an anode contact region 24 side than boundaries b3 between the anode contact region 24 and the anode region 23. The anode region 23, the anode contact region 24, the pillar region 20, and the gate trenches 30 extend in parallel in a y direction.

In the direction along which the pillar exposing area 41, the pillar contacting areas 42, and the anode contacting areas 43 align (x direction), a width w42 of the pillar contacting area 42 is smaller than a width w41 of the pillar exposing area 41. Further, in the x direction, the width w42 of the pillar contacting area 42 is smaller than a width w43 of the anode contacting area 43. When the width w41 of the pillar exposing area 41, the width w42 of the pillar contacting area 42, and the width w43 of the anode contacting area 43 are to be compared, both the front surface 50 of the semiconductor substrate 2 and the position deeper than the front surface 50 can be observed to make the comparison.

Figure 5:
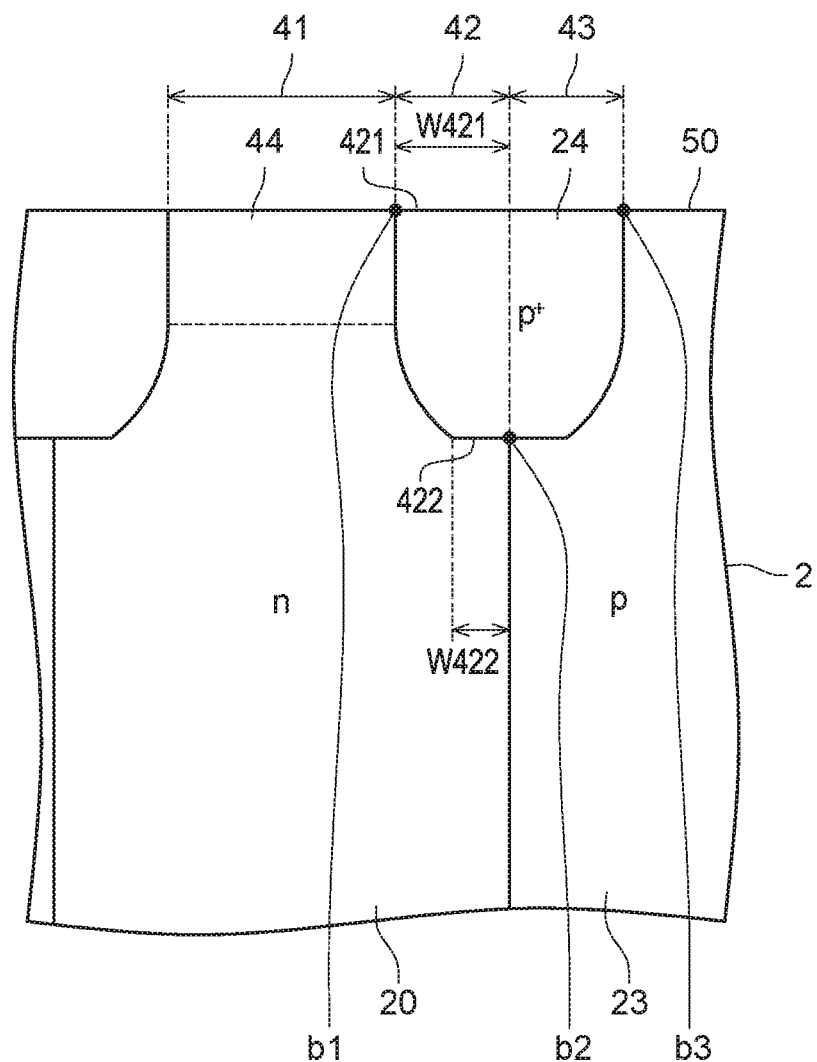
FIG. 5 is a cross sectional diagram of a primary part V of FIG. 2.

Further, as shown in FIG. 5, each pillar contacting area 42 decreases at its positions farther away from the front surface 50 of the semiconductor substrate 2 in the depth direction of the semiconductor substrate 2. The width of each pillar contacting area 42 is reduced in the direction along which the pillar contacting area 42 and the anode contacting area 43 are aligned (x direction). A width w422 of a lower end 422 of the pillar contacting area 42 is smaller than a width w421 of an upper end 421 of the pillar contacting area 42. However, the width w422 of the lower end 422 of the pillar contacting area 42 is larger than half the width w421 of an upper end 421 of the pillar contacting area 42.

Figure 6:
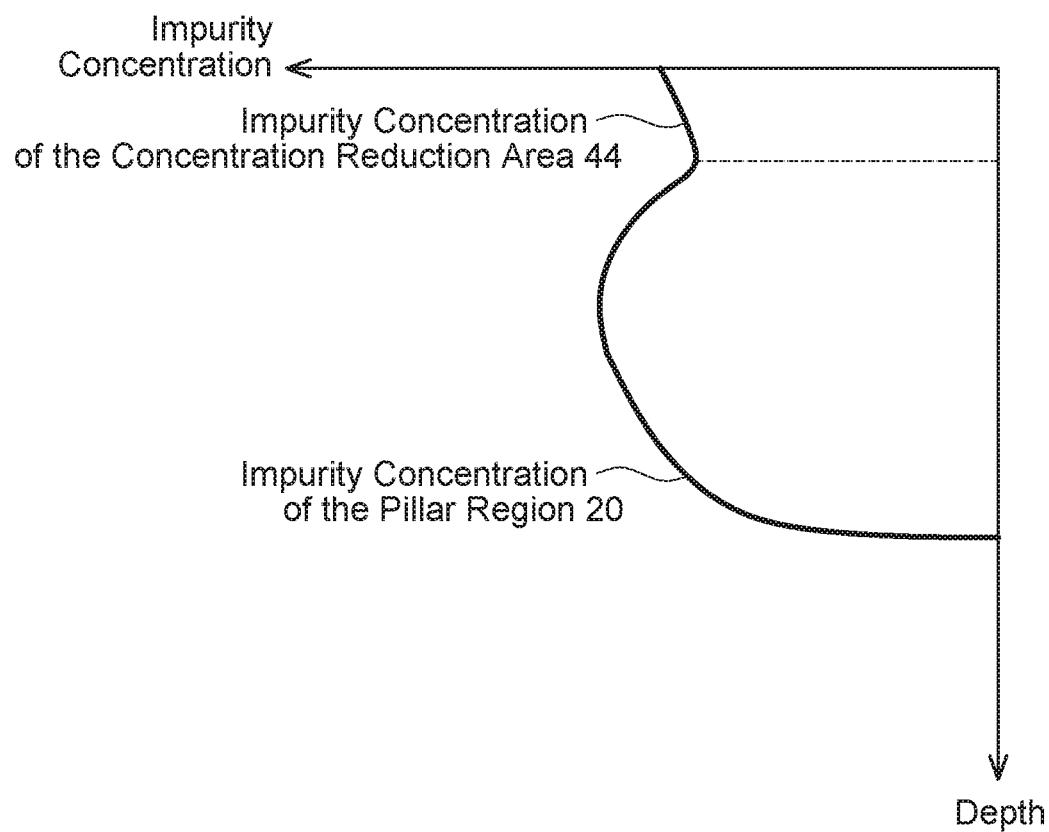
FIG. 6 is a diagram indicating the impurity concentration profile at a VI-VI cross section in FIG. 2.

Each pillar region 20 comprises a reduced concentration area 44. The reduced concentration areas 44 are provided at the upper ends of the pillar regions 20. The reduced concentration areas 44 are provided in the area exposed on the front surface 50 of the semiconductor substrate 2. As shown in FIG. 6, the impurity concentration of the pillar regions 20 changes gradually along the depth direction of the semiconductor substrate 2 (z direction). In each reduced concentration area 44, the impurity concentration of the pillar region 20 gradually decreases at positions farther away from the front surface 50 of the semiconductor substrate 2 in the depth direction of the semiconductor substrate 2 (z direction). A peak position of the impurity concentration of each pillar region 20 is located at a deeper position than the reduced concentration area 44. The peak positions of the impurity concentration of the pillar regions 20 are located at deeper positions than the lower ends 242 of the anode contact regions 24.

Next, an operation of the semiconductor device provided with the above configuration will be described. When the semiconductor device 1 is to be used, a voltage that allows the back surface electrode 6 to be positively charged (that is, a voltage that acts as a forward voltage for the IGBT region 3) is applied between the front surface electrode 5 and the back surface electrode 6. Further, an ON potential (potential that is equal to or greater than a potential needed to generate channels in the body region 16) is applied to the gate electrodes 32. Due to this, the IGBT of the semiconductor device 1 is turned on.

When the IGBT of the semiconductor device 1 is turned on, the channels are formed in the ranges of the body region 16 making contact with the gate trenches 30. Then, electrons flow from the front surface electrode 5 to the drift region 13 through the emitter regions 17, the channels foamed in the body region 16, and the barrier region 15. Thereafter, the electrons flow to the back surface electrode 6 via the buffer region 12 and the collector region 11. Further, holes flow from the back surface electrode 6 to the front surface electrode 5 through the collector region 11, the buffer region 12, the drift region 13, the barrier region 15, the body region 16, and the body contact regions 18.

Next, when the potential of the gate electrodes 32 is switched from ON potential to an OFF potential, the channels that were fanned in the body region 16 disappear. Due to this, the IGBT of the semiconductor device 1 is turned off. Further, a voltage that allows the front surface electrode 5 to be positively charged (that is, a voltage that acts as a forward voltage for the diode region 4) is applied between the front surface electrode 5 and the back surface electrode 6. Due to this, the diode (FWD) of the semiconductor device 1 is turned on. When the diode (FWD) is turned on, the holes flow from the front surface electrode 5 to the back surface electrode 6 through the anode contact regions 24, the anode region 23, the barrier region 25, the drift region 13, the buffer region 12, and the cathode region 21. Further, the electrons flaw from the back surface electrode 6 to the front surface electrode 5 through the cathode region 21, the buffer region 12, the drift region 13, the barrier region 25, the anode region 23, and the anode contact regions 24.

Thereafter, the voltage that allows the hack surface electrode 6 to he positively charged (that is, a voltage that acts as a reverse voltage for the diode region 4 (voltage that acts as the forward voltage for the IGBT region 3)) is applied between the front surface electrode 5 and the back surface electrode 6. Due to this, the diode (FWD) of the semiconductor device 1 is recovered. When the diode (FWD) is recovered, the holes that were accumulated in the diode region 4 of the semiconductor substrate 2 are discharged to the front surface electrode 5, and the electrons are discharged to the back surface electrode 6.

As is clear from the above description, in the semiconductor device 1, in the plan view of the semiconductor substrate 2, the semiconductor substrate 2 includes the pillar exposing areas 41 in each of which the pillar region 20 is exposed on the front surface 50 of the semiconductor substrate 2, the pillar contacting areas 42 in each of which the pillar region 20 is in contact with the deeper side of the corresponding anode contact region 24, and the anode contacting areas 43 in each of which the anode region 23 is in contact with the deeper side of one of the anode contact regions 24. Further, the width w42 of the pillar contacting areas 42 is smaller than the width w43 of the anode contacting areas 43 in the direction along which the pillar contacting areas 42 and the anode contacting areas 43 are aligned. According to such a configuration, since the anode contact regions 24 and the pillar regions 20 are not separated but are in contact, so the regions for providing the anode contact regions 24 and the pillar regions 20 can be made smaller. Due to this, the intervals between the adjacent gate trenches 30 can be made smaller, and the number of the gate trenches 30 to be provided on the semiconductor substrate 2 can be increased. Thus, the number of the gate trenches 30 per a unit area of the semiconductor substrate 2 can be increased so as to increase a density of the gate trenches 30 thereon.

Further, in the above semiconductor device 1, the pn junction diodes are formed by the p-type anode contact regions 24 and the n-type pillar regions 20 making contact. In this semiconductor device 1, when the diode (FWD) turns on when the voltage acting as the forward voltage for the diode region 4 is applied), not only the holes flow from the front surface electrode 5 to the back surface electrode 6 through the anode contact regions 24, the anode region 23, the barrier region 25, the drift region 13, the buffer region 12, and the cathode region 21 as aforementioned, but also the holes flow from the front surface electrode 5 to the back surface electrode 6 through the anode contact regions 24, the pillar regions 20, the barrier region 25, the drift region 13, the buffer region 12, and the cathode region 21. That is, when the diode (FWD) is turned on, the holes flow from the p-type anode contact regions 24 into the n-type pillar regions 20. At this occasion, according to the above configuration, the width w42 of the pillar contacting areas 42 where the pillar regions 20 make contact with the deeper sides of the pillar contact regions 24 is smaller than the width w43 of the anode contacting areas 43 where the anode region 23 makes contact with the deeper sides of the anode contact regions 24. Due to this, the contacting areas between the anode contact regions 24 and the pillar regions 20 can be suppressed than the contacting areas between the anode contact regions 24 and the anode region 23. Due to this, an amount of the holes flowing in from the anode contact regions 24 to the pillar regions 20 can be made less than an amount of the holes flowing in from the anode contact regions 24 to the anode region 23. Accordingly, the amount of the holes flowing from the anode contact regions 24 to the pillar regions 20 can be suppressed. According to the above, with the aforementioned semiconductor device 1, the amount of the holes flowing in from the anode contact regions 24 to the pillar regions 20 can be suppressed even when the density of the gate trenches 30 is increased.

As a result, since no excessive holes are accumulated upon when the diode (FWD) is turned on, so the time required for the holes that had been accumulated in the semiconductor substrate 2 to be discharges to the front surface electrode 5 when the diode is recovered can be shortened. According to this, the switching speed can be increased.

Further, in the semiconductor device 1, when a voltage is applied between the front surface electrode 5 and the back surface electrode 6, a voltage is applied in the depth direction of the semiconductor substrate 2 (vertical direction). At this occasion, if the interface 71 of the anode contact regions 24 and the pillar regions 20are oriented along the depth direction of the semiconductor substrate 2 (vertical direction), a voltage applied direction and a direction along which the interfaces 71 are oriented match, as a result of which the holes flow easily from the anode contact regions 24 to the pillar regions 20. However, according to the above configuration, since a difference between the width w422 of the lower ends 422 of the pillar contacting areas 42 and the width w421 of the upper ends 421 of the pillar contacting areas 42 becomes small due to the width w422 of the lower ends 422 of the pillar contacting areas 42 being greater than half the width w421 of the upper ends 421 of the pillar contacting areas 42, so an inclined angle of the interfaces 71 of the anode contact regions 24 and the pillar regions 20 becomes large, and the interfaces 71 come to be oriented in a direction along the front surface 50 of the semiconductor substrate 2 (lateral direction). Due to this, even if a voltage is applied in the depth direction of the semiconductor substrate 2, the holes are less likely to flow from the anode contact regions 24 to the pillar regions 20 because of the voltage applied direction and the direction along which the interfaces 71 are oriented are different. Thus, the amount of the holes flowing in from the anode contact regions 24 to the pillar regions 20 can further be suppressed.

Further, in the above semiconductor device I, the p-type impurity concentration at the lower ends 242 of the anode contact regions 24 is made higher than half the p-type impurity concentration at the upper ends 241 of the anode contact regions 24. Due to this, since the difference in the impurity concentration becomes small between the lower ends 242 and the upper ends 241 of the anode contact regions 24, a difference in the width of the lower ends 242 and the width of the upper ends 241 of the anode contact regions 24 after thermal diffusion becomes small. As a result of this, the inclined angle of the interfaces 71 of the anode contact regions 24 and the pillar regions 20 becomes large, so the hales are less likely to flow from the anode contact regions 24 to the pillar regions 20 similar to the above.

Further, in the above semiconductor device 1, the pillar regions 20 comprise the reduced concentration areas 44 where the n-type impurity concentration is gradually decreased at positions farther away from the front surface 50 of the semiconductor substrate 2 in the depth direction of the semiconductor substrate 2. Due to this, since the n-type impurity concentration of the pillar regions 20 at the front surface 50 of the semiconductor substrate 2 is made high, so the anode contact regions 24 that are adjacent to the pillar regions 20 at the front surface 50 of the semiconductor substrate 2 can be prevented from diffusing in a direction along the front surface 50 of the semiconductor substrate 2. Due to this, the upper ends 241 of the anode contact regions 24 are less likely to be diffused in the direction along the front surface 50 of the semiconductor substrate 2 (lateral direction), so the difference in the width of the upper ends 241 and the width of the lower ends 242 of the anode contact regions 24 become even smaller. As a result, the inclined angle of the interfaces 71 of the anode contact regions 24 and the pillar regions 20 becomes large, so the holes are less likely to flow from the anode contact regions 24 to the pillar regions 20 similar to the above.

An embodiment has been described above, but the specific configurations are not limited thereto. In the below description, configurations identical to those of the above description will be given the same reference signs, and the explanation thereof may be omitted.

Second Embodiment

Figure 7:
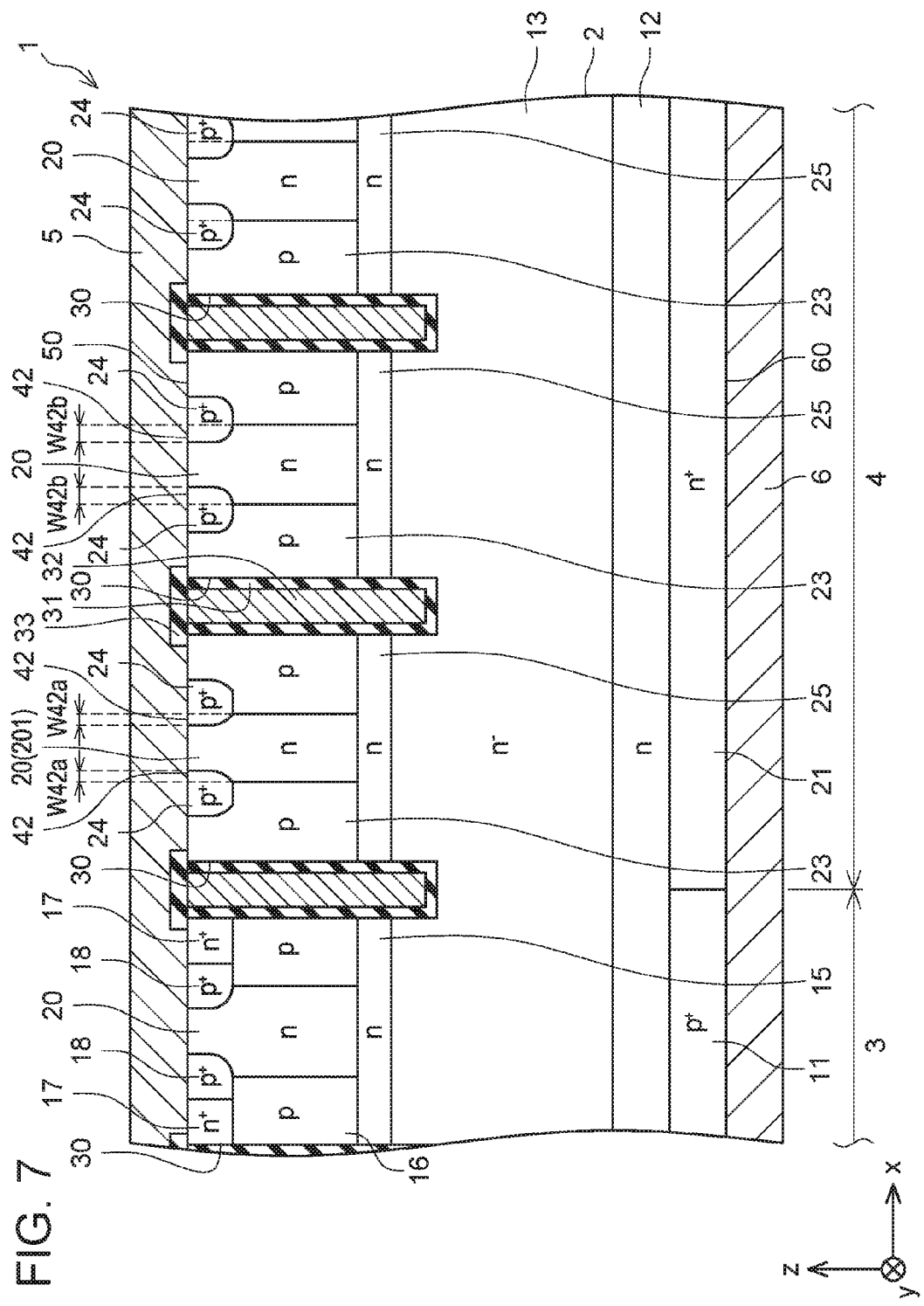
FIG. 7 is a cross sectional diagram of a semiconductor device of a second embodiment.

In a semiconductor device 1 of a second embodiment, as shown in FIG. 7, among the plurality of pillar regions 20 provided in the diode region 4, a width w42a of a pillar contacting area 42 of a pillar region 201 located closest to the IGBT region 3 is smaller than a width w42b of the pillar contacting areas 42 of the pillar regions 20 other than the closest pillar region 201. That is, among the pillar contacting areas 42 of a plurality of cells in the diode region 4, the width w42a of the pillar contacting area 42 in the cell closest, to the IGBT region 3 is the smallest. At the portion where the IGBT region 3 and the diode region 4 are making adjacent contact, the holes flow in from the IGBT region 3 to the diode region 4 when the diode (FWD) is turned on, the holes are likely to be accumulated in the diode region 4. However, according to the above configuration, the contacting area of the anode contact region 24 is kept small in the pillar region 201 being closest to the IGBT region 3. Due to this, the amount of the holes flowing in from the anode contact regions 24 to the pillar regions 20 can be suppressed in the diode region 4 on the closer side to the IGBT region 3. As a result, the time required for the holes that were accumulated in the semiconductor substrate 2 at a portion close to the IGBT region 3 to be discharged to the front surface electrode 5 can be shortened, and a switching speed can be increased.

Third Embodiment

Figure 8:
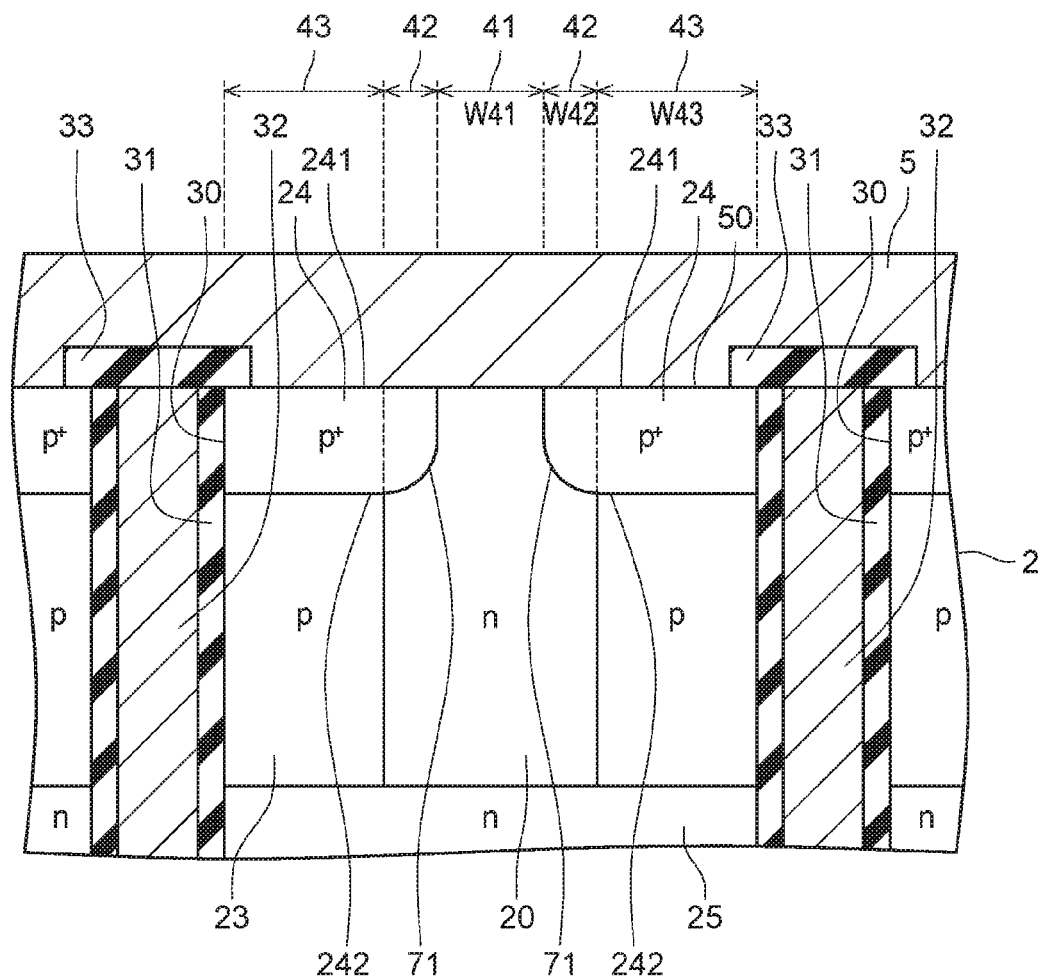
FIG. 8 is a cross sectional diagram of a primary part semiconductor device of a third embodiment.

Further, in the above embodiments the anode contact regions 24 were provided at only parts of the anode region 23 on the front surface side thereof, however, no limitation is made to this configuration. In a semiconductor 1 of a third embodiment, as shown in FIG. 8, an anode contact region 24 may be provided over an entirety of the front surface side of the anode region 23. The gate trenches 30 extend in the depth direction of the semiconductor substrate 2 by piercing through the anode contact region 24.

Other Embodiments

Further, a method by Which the anode contact regions 24 and the pillar regions 20 are formed is not particularly limited. For example, in an example of a method of manufacturing a semiconductor device, the anode contact regions 24 are formed on the semiconductor substrate 2 after the gate trenches 30 are formed on the semiconductor substrate 2. Further, the pillar regions 20 are also formed on the semiconductor substrate 2 after the gate trenches 30 are formed on the semiconductor substrate 2.

Further, upon forming the anode contact regions 24, thermal diffusion by an annealing after having injected impurities into the semiconductor substrate 2 is not performed, and the thermal diffusion is performed by heat generated upon performing a reflow process on the interlayer insulating films 33. Further, similarly, upon forming the pillar regions 20, the thermal diffusion by the annealing after having injected impurities into the semiconductor substrate 2 is not performed, and the thermal diffusion is performed by the heat generated upon performing the reflow process on the interlayer insulating films 33. A temperature of the reflow process of the interlayer insulating films 33 is for example 850° C. to 1050° C. Further, processing time of the reflow process of the interlayer insulating films 33 is for example 10 to 120 minutes.

Figure 9:
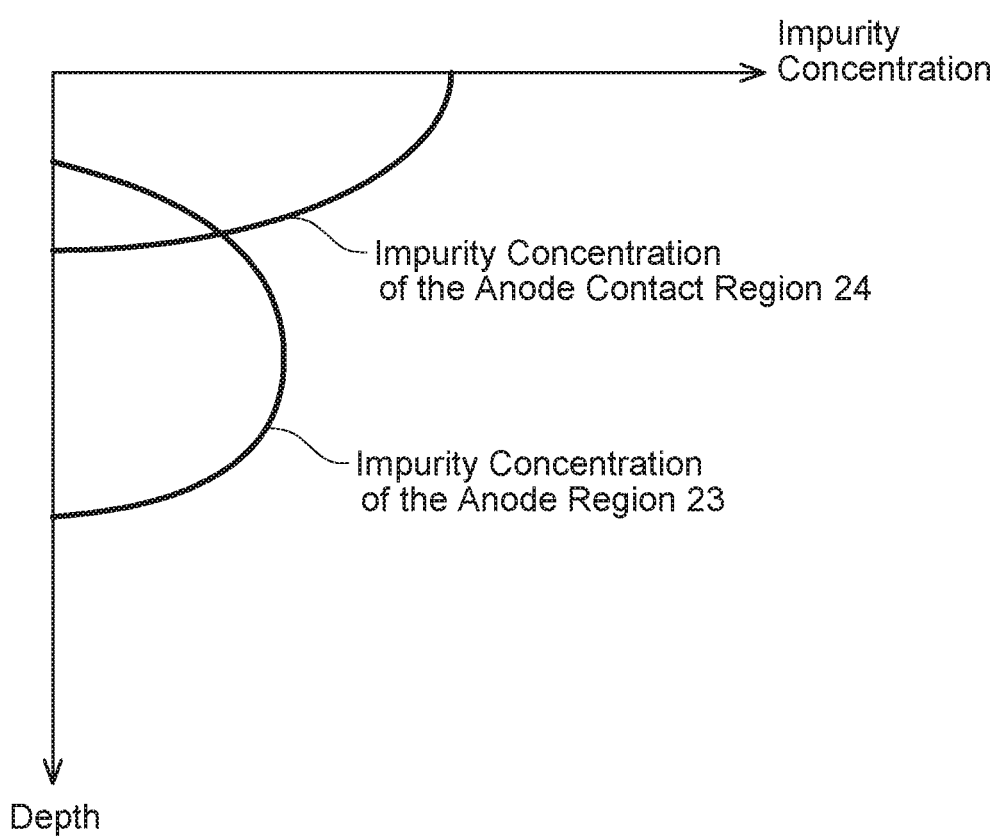
FIG. 9 is a diagram indicating an example of the impurity concentration profile.

Further, a peak position of the impurity concentration of the anode region 23 is not particularly limited. In the example shown in FIG. 9, the peak of the impurity concentration of the anode region 23 is located at a deeper position than the lower ends 242 of the anode contact regions 24. A part of a range Where the impurities were injected for forming the anode region 23 overlaps with a part of a range where the impurities were injected for forming the anode contact regions 24. Further, the peak positions of the impurity concentration of the pillar regions 20 are not particularly limited.

Figure 10:
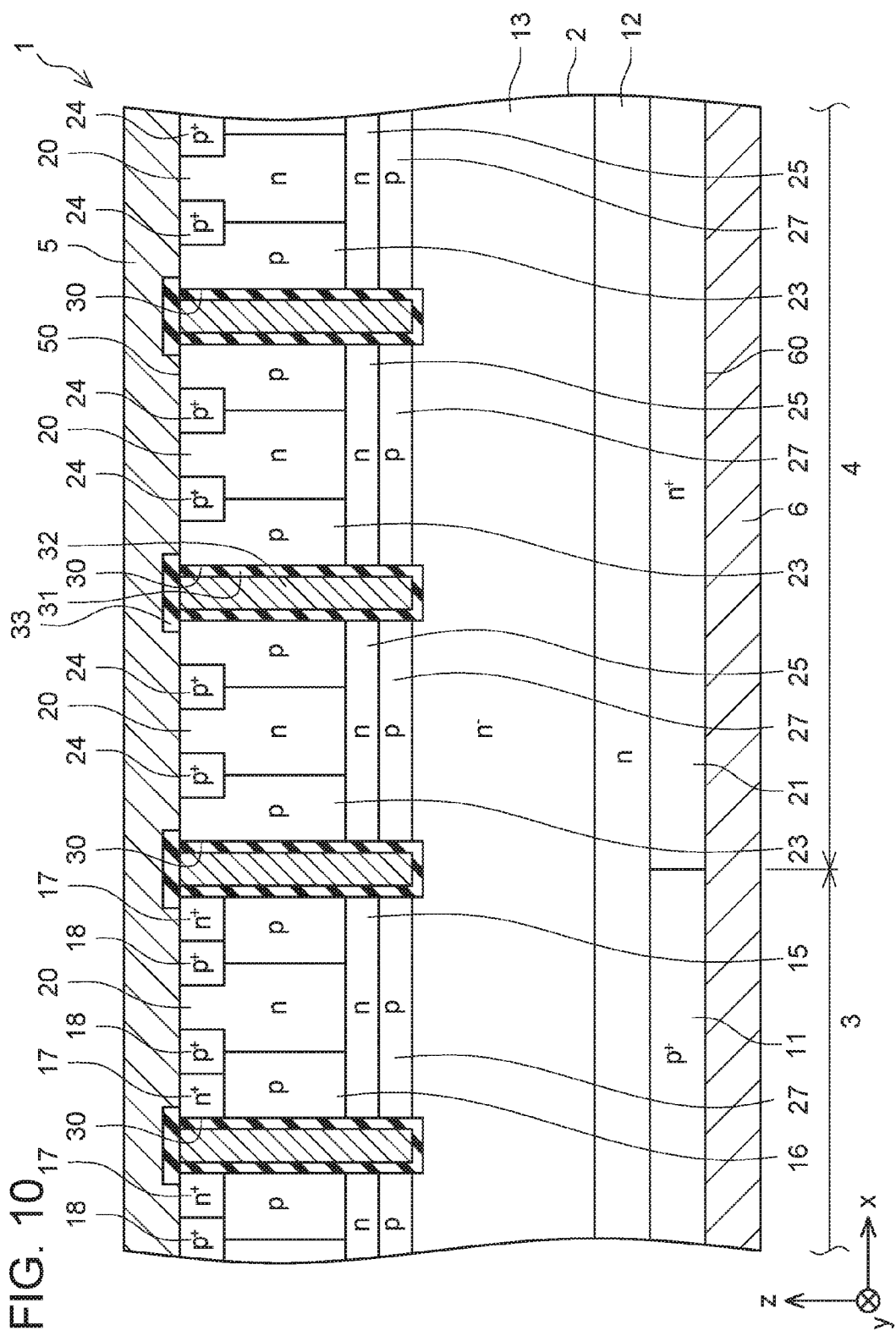
FIG. 10 is a cross sectional diagram of a semiconductor device of another embodiment.
Figure 11:
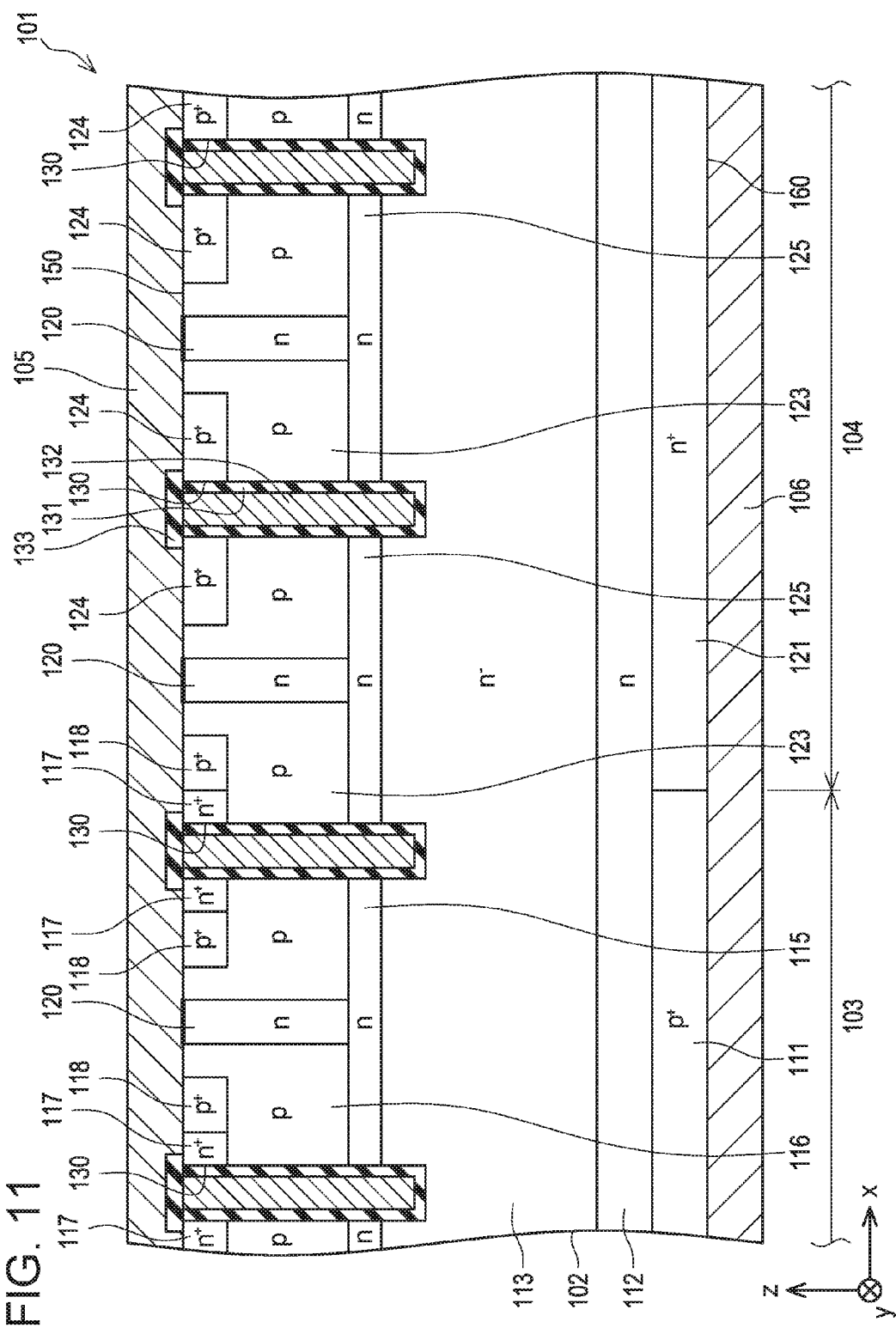
FIG. 11 is a cross sectional diagram of a conventional semiconductor device.

Further, the configuration of the semiconductor substrate 2 is not limited to the above embodiments. In another embodiment, as shown in FIG. 10, an electric field expansion inhibiting region 27 may be provided in the IGBT region 3 and the diode region 4 of the semiconductor substrate 2. The electric field expansion inhibiting region 27 is a p-type region. An impurity concentration of the electric field expansion inhibiting region 27 is equal to the impurity concentration of the body region 16. Further, the impurity concentration of the electric field expansion inhibiting region 27 is equal to the impurity concentration of the anode region 23. The electric field expansion inhibiting region 27 is provided on the front surface side of the drift region 13. The electric field expansion inhibiting region 27 is provided on the back surface side of the barrier regions 15, 25. The electric field expansion inhibiting region 27 is provided between the drift region 13 and the barrier regions 15, 25.

According to the configuration shown in FIG. 10, when the diode (FWD) is turned on, the electrons flow from the back surface electrode 6 to the front surface electrode 5 through the semiconductor substrate 2. At this occasion, the presence of the electric field expansion inhibiting region 27 allows to suppress an amount of the electrons flowing into the anode contact regions 24. Accompanying this, the amount of the holes flowing from the anode contact regions 24 into the pillar regions 20 can be suppressed.

Specific examples of the present invention has been described in detail, however, these are mere exemplary indications and thus do not limit the scope of the claims. The art described in the claims include modifications and variations of the specific examples presented above. Technical features described in the description and the drawings may technically be useful alone or in various combinations, and are not limited to the combinations as originally claimed.

Further, the art described in the description and the drawings may concurrently achieve a plurality of aims, and technical significance thereof resides in achieving any one of such aims.

Some of the features characteristic to below-described embodiments will herein be listed. It should be noted that the respective technical elements are independent of one another, and are useful solely or in combinations.

1. A width of the pillar contacting area is reduced from the front surface of the semiconductor substrate toward a deeper side along a depth direction of the semiconductor substrate. The width of a lower end of the pillar contacting area is preferably greater than half the width of an upper end of the pillar contacting area.

According to this configuration, since a difference between the width of the lower end and the width of the upper end of the pillar contacting area becomes small, so an inclined angle of an interface of the anode contact region and the pillar region becomes large, and the interface comes to be oriented along a direction along the front surface of the semiconductor substrate (lateral direction). Due to this, even if a voltage is applied in the depth direction of the semiconductor substrate (vertical direction), a voltage applied direction and a direction along which the interface is oriented are different, so the holes are less likely to flow from the anode contact region into the pillar region. Thus, the amount of the holes flowing from the anode contact region into the pillar region can be suppressed.

2. The impurity concentration of the anode contact region is gradually reduced from the front surface of the semiconductor substrate toward a deeper sidealong a depth direction of the semiconductor substrate. The impurity concentration of a lower end of the anode contact region is preferably higher than half the impurity concentration of an upper end of the anode contact region.

According to this configuration, since a difference in the impurity concentration between the lower end and the upper end of the anode contact region becomes small, a difference in a diffusion amount between the lower end and the upper end of the anode contact region becomes small. Due to this, the difference in the width of the lower end and the width of the upper end of the anode contact region becomes small. As a result, an inclined angle of the interface of the anode contact region and the pillar region becomes large, and the interface comes to be oriented along the direction along the front surface of the semiconductor substrate (lateral direction). Due to this, similar to the above, even if a voltage is applied in the depth direction of the semiconductor substrate (vertical direction), the voltage applied direction and the direction along which the interface is oriented arc different, so the holes are less likely to flow from the anode contact region into the pillar region. Thus, the amount of the holes flowing from the anode contact region into the pillar region can be suppressed.

3. The pillar region preferably comprises a reduced concentration area, and the impurity concentration of the reduced concentration area may be gradually reduced from the front surface of the semiconductor substrate toward a deeper side along a depth direction of the semiconductor substrate.

According to this configuration, since the n-type impurity concentration of the pillar region at the front surface of the semiconductor substrate is made high, the anode contact region adjacent to the pillar region at the front surface of the semiconductor substrate can be inhibited from diffusing in the direction along the front surface of the semiconductor substrate (lateral direction). Due to this, since the upper end of the anode contact region is less likely to be diffused in the direction along the front surface of the semiconductor substrate (lateral direction), the difference in the width of the lower end and the width of the upper end of the anode contact region becomes small. As a result, the inclined angle of the interface of the anode contact region and the pillar region becomes large, and the interface comes to be oriented along the direction along the front surface of the semiconductor substrate (lateral direction). Due to this, similar to the above, even if a voltage is applied in the depth direction of the semiconductor substrate (vertical direction), the voltage applied direction and the direction along which the interface is oriented are different, so the holes are less likely to flow from the anode contact region into the pillar region. Thus, the amount of the holes flowing from the anode contact region into the pillar region can be suppressed.

4. A plurality of pillar regions is provided in the diode region, and among the plurality of pillar regions in the diode region, a pillar region located closest to the IGBT region preferably has the pillar contacting area with a smaller width than those of the other pillar regions.

A portion close to the IGBT region tends to accumulate excessive holes in the semiconductor substrate due to the holes flowing in from the IGBT region into the diode region. In view of this, according to the above configuration, the amount of the holes flowing from the anode contact region closest to the IGBT region into the pillar region can be suppressed than the amount of the holes flowing from other anode contact regions into the pillar region.

Further, time required for discharging the holes accumulated in the semiconductor substrate at the portion close to the IGBT region to be discharged to the front surface electrode can be shortened, and the switching speed can be increased. Further, since the amount of the holes flowing into the portion close to the IGBT region can be suppressed, heat generation at the portion close to the IGBT region can be suppressed.

What is claimed is:

1. A semiconductor device comprising:
   a semiconductor substrate including an IGBT region and a diode region; and
   a front surface electrode provided on a front surface of the semiconductor substrate,
   wherein the IGBT region comprises:
   an n-type drift region;
   an n-type barrier region provided on a front surface side of the drift region;
   a p-type body region provided on a front surface side of the barrier region;
   an n-type emitter region provided on a front surface side of the body region and configured to electrically connect to the front surface electrode;
   a p-type body contact region provided on the front surface side of the body region at a position different from a position of the emitter region, the p-type body contact region having an impurity concentration higher than an impurity concentration of the body region, and configured to electrically connect to the front surface electrode;
   a plurality of gate trenches extending from the front surface of the semiconductor substrate, piercing the emitter region, the body region and the bather region and reaching the drift region; and
   an n-type pillar region extending from the front surface of the semiconductor substrate between adjacent gate trenches, piercing the body region and reaching the barrier region, and configured to electrically connect to the front surface electrode and the barrier region;
   wherein the diode region comprises:
   an n-type drift region;
   an n-type barrier region provided on a front surface side of the drift region;
   a p-type anode region provided on a front surface side of the barrier region;
   a p-type anode contact region provided on at least a part of a front surface side of the anode region, the p-type anode contact region having the impurity concentration higher than an impurity concentration of the anode region, and configured to electrically connect to the front surface electrode;
   a plurality of gate trenches extending from the front surface of the semiconductor substrate, piercing at least the anode region and the barrier region and reaching the drift region; and
   an n-type pillar region extending from the front surface of the semiconductor substrate between adjacent gate trenches, piercing the anode contact region and the anode region and reaching the barrier region, and configured to electrically connect to the front surface electrode and the barrier region;
   wherein in a plan view of the semiconductor substrate, the semiconductor substrate includes a pillar exposing area in which the pillar region is exposed on the front surface of the semiconductor substrate, a pillar contacting area in which the pillar region is in contact with a deeper side of the anode contact region, and an anode contacting area in which the anode region is in contact with the deeper side of the anode contact region, and
   wherein in a direction along which the pillar contacting area and the anode contacting area are aligned, a width of the pillar contacting area is smaller than a width of the anode contacting area.

2. The semiconductor device according to claim 1, wherein
   a width of the pillar contacting area is reduced from the front surface of the semiconductor substrate toward a deeper side along a depth direction of the semiconductor substrate, and
   the width of a lower end of the pillar contacting area is greater width of an upper end of the pillar contacting area.

3. The semiconductor device according to claim 1, wherein
   the impurity concentration of the anode contact region is gradually reduced from the front surface of the semiconductor substrate toward a deeper side along a depth direction of the semiconductor substrate, and
   the impurity concentration of a lower end of the anode contact region is higher than half the impurity concentration of an upper end of the anode contact region.

4. The semiconductor device according to claim 1, wherein
   the pillar region comprises a reduced concentration area, and
   the impurity concentration of the reduced concentration area is gradually reduced from the front surface of the semiconductor substrate toward a deeper side along a depth direction of the semiconductor substrate.

5. The semiconductor device according to claim 1, wherein
   a plurality of pillar regions is provided in the diode region, and among the plurality of pillar regions in the diode region, a pillar region located closest to the IGBT region has the pillar contacting all a smaller width than those of the other pillar regions.

* * * * *

UNITED STATES PATENT AND TRADEMARK OFFICE
CERTIFICATE OF CORRECTION

PATENT NO. : 9,666,579 B2  
APPLICATION NO. : 15/163009  
DATED : May 30, 2017  
INVENTOR(S) : Masaru Senoo et al.

Page 1 of 2

It is certified that error appears in the above-identified patent and that said Letters Patent is hereby corrected as shown below:

In the Specification

At Column 1, Line 42, change from "the bather region" to "the barrier region"

At Column 1, Line 47, change from "the bather region" to "the barrier region"

At Column 1, Line 61, change from "the drill region" to "the drift region"

At Column 2, Line 14, change from "the gale trenches" to "the gate trenches"

At Column 3, Line 19, change from "the bather region" to "the barrier region"

At Column 3, Line 21, change from "n-type drill region" to "n-type drift region"

At Column 3, Line 22, change from "the bather region" to "the barrier region"

At Column 3, Line 31, change from "the banger region" to "the barrier region"

At Column 3, Line 35, change from "the harrier region" to "the barrier region"

At Column 4, Line 39, change from "primary part semiconductor" to "primary part of a semiconductor"

At Column 5, Line 50, change from "the bather region" to "the barrier region"

At Column 5, Line 51, change from "the bather region" to "the barrier region"

At Column 5, Line 60, change from "the bather region" to "the barrier region"

Signed and Sealed this  
Twenty-first Day of August, 2018

Andrei Iancu  
*Director of the United States Patent and Trademark Office*

CERTIFICATE OF CORRECTION (continued)
U.S. Pat. No. 9,666,579 B2

At Column 6, Line 07, change from "each termed in" to "each formed in"

At Column 6, Line 45, change from "the bather region" to "the barrier region"

At Column 6, Line 47, change from "the bather region" to "the barrier region"

At Column 6, Line 52, change from "the bather region" to "the barrier region"

At Column 8, Line 36, change from "along Which the" to "along which the"

At Column 9, Line 52, change from "channels foamed in" to "channels formed in"

At Column 9, Line 62, change from "were fanned in" to "were formed in"

At Column 10, Line 07, change from "electrons flaw from" to "electrons flow from"

At Column 10, Line 11, change from "the hack surface" to "the back surface"

At Column 10, Line 12, change from "to he positively" to "to be positively"

At Column 11, Line 52, change from "device I" to "device 1"

At Column 11, Line 64, change from "the hales are" to "the holes are"

At Column 12, Line 66, change from "by Which" to "by which"

At Column 13, Line 28, change from "range Where the" to "range where the"

In the Claims

At Column 15, Line 63, Claim 1 change from "the bather region" to "the barrier region"

At Column 16, Line 45, Claim 2 change from "greater width" to "greater than half the width"

At Column 17, Line 03, Claim 5 change from "contacting all a smaller" to "contacting area with a smaller"